United States Patent
Iwabuki et al.

(10) Patent No.: US 9,680,464 B2
(45) Date of Patent: Jun. 13, 2017

(54) SEMICONDUCTOR SWITCH CIRCUIT

(71) Applicant: MITSUBISHI ELECTRIC CORPORATION, Chiyoda-ku (JP)

(72) Inventors: Hiroyasu Iwabuki, Chiyoda-ku (JP); Kazufumi Tanaka, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/785,783

(22) PCT Filed: Mar. 26, 2014

(86) PCT No.: PCT/JP2014/058414
§ 371 (c)(1),
(2) Date: Oct. 20, 2015

(87) PCT Pub. No.: WO2015/011949
PCT Pub. Date: Jan. 29, 2015

(65) Prior Publication Data
US 2016/0197604 A1    Jul. 7, 2016

(30) Foreign Application Priority Data

Jul. 24, 2013 (JP) .................................. 2013-153443

(51) Int. Cl.
*H03K 3/00* (2006.01)
*H03K 17/567* (2006.01)
(Continued)

(52) U.S. Cl.
CPC ........... *H03K 17/567* (2013.01); *H01H 9/541* (2013.01); *H01H 33/59* (2013.01); *H03K 17/687* (2013.01)

(58) Field of Classification Search
None
See application file for complete search history.

(56) References Cited

U.S. PATENT DOCUMENTS 5,266,869 A    11/1993    Usami
2010/0283439 A1*    11/2010    Singh ................... H03K 17/102
                                                                                323/282
(Continued)

FOREIGN PATENT DOCUMENTS

JP    49-14335 Y1    4/1974
JP    60-68517 A     4/1985
(Continued)

OTHER PUBLICATIONS

International Search Report Issued on Apr. 22, 2014 in PCT/JP14/058414 Filed Mar. 26, 2014.
(Continued)

*Primary Examiner* — Lincoln Donovan
*Assistant Examiner* — Khareem E Almo
(74) *Attorney, Agent, or Firm* — Oblon, McClelland, Maier & Neustadt, L.L.P.

(57) ABSTRACT

A semiconductor switch circuit includes a plurality of switching units connected in series between a high-voltage node and a low-voltage node, and a plurality of diodes provided in association with the plurality of switching units, respectively. Respective cathodes of the plurality of diodes are connected to the plurality of switching units, respectively, and the anode of the diode associated with the switching unit connected to the low-voltage node receives a predetermined power supply voltage. Each switching unit includes a semiconductor switching device, a gate drive circuit driving the semiconductor switching device, and a DC-DC converter receiving a DC voltage from a cathode of the associated diode and supplying drive power to the gate drive circuit.

8 Claims, 8 Drawing Sheets

(51) Int. Cl.
*H01H 9/54* (2006.01)
*H01H 33/59* (2006.01)
*H03K 17/687* (2006.01)

(56) References Cited

U.S. PATENT DOCUMENTS

| | | | | |
|---|---|---|---|---|
| 2012/0013371 A1* | 1/2012 | Nakatake | ............ | H03K 17/168 |
| | | | | 327/109 |
| 2012/0018404 A1 | 1/2012 | Matsuo et al. | | |
| 2012/0299393 A1 | 11/2012 | Haefner et al. | | |
| 2016/0099650 A1* | 4/2016 | Yabumoto | ............ | H03K 17/107 |
| | | | | 327/109 |
| 2016/0126822 A1* | 5/2016 | Lyle | .................. | H02M 1/088 |
| | | | | 363/123 |
| 2016/0197600 A1* | 7/2016 | Kuznetsov | ............... | H03K 3/45 |
| | | | | 307/106 |
| 2016/0197604 A1* | 7/2016 | Iwabuki | ............... | H03K 17/687 |
| | | | | 327/109 |

FOREIGN PATENT DOCUMENTS

| | | | |
|---|---|---|---|
| JP | H03-237813 | A | 10/1991 |
| JP | 4-126395 | A | 4/1992 |
| JP | 7-230890 | A | 8/1995 |
| JP | 8-051770 | A | 2/1996 |
| JP | 2000-004059 | A | 1/2000 |
| JP | 2002-084762 | A | 3/2002 |
| JP | 2002-281737 | A | 9/2002 |
| JP | 2003-018821 | A | 1/2003 |
| JP | 2008-96754 | A | 4/2008 |
| JP | 2009-177951 | A | 8/2009 |
| JP | 2010-035389 | A | 2/2010 |
| JP | 2012-28193 | A | 2/2012 |

OTHER PUBLICATIONS

Office Action mailed Dec. 20, 2016 in Japanese Patent Application No. 2015-528165 (with English Translation).
Supplementary European Search Report with EPO Communication issued Feb. 16, 2017, in Application No. 14828918.4 (7 pages).

* cited by examiner

SEMICONDUCTOR SWITCH CIRCUIT

TECHNICAL FIELD

The present invention relates to a semiconductor switch circuit used for a high-voltage DC circuit breaker.

BACKGROUND ART

A semiconductor switch circuit used for a high-voltage DC circuit breaker has a plurality of semiconductor switching devices connected in series, and causes these semiconductor switching devices to perform a switching operation to thereby control a high-voltage/large-current power supply line. In order to control the conduction state of a plurality of semiconductor switching devices connected in series, it is necessary to supply, to the gate terminal of each semiconductor switching device, a gate signal generated by a gate drive circuit using the potential of the source terminal of the semiconductor switching device as a reference potential.

Japanese Patent Laying-Open No. 2000-4059 (PTD 1) discloses a configuration where a transformer having a common core and a plurality of different secondary windings generates an AC voltage in each secondary winding, converts the AC voltage to a DC voltage, and supplies the DC voltage to each gate drive circuit.

Japanese Patent Laying-Open No. 3-237813 (PTD 2) discloses a pulse generation circuit including a main capacitor, switch means made up of a plurality of field-effect transistors connected in series, a gate circuit supplying a gate signal to each field-effect transistor, and a gate power supply supplying a power supply voltage to the gate circuit. The gate power supply is made up of a DC power supply and a capacitor receiving and storing a voltage of this DC power supply provided via a diode.

Japanese Patent Laying-Open No. 2009-177951 (PTD 3) discloses a power conversion apparatus including an individual gate drive unit which is made up of gate drivers and interface circuits connected respectively to a plurality of switches with which a main circuit is configured. The individual gate drive unit does not require a dedicated power supply. Electric power is supplied to the gate drive unit from common power supplies fewer than the number of switches or from the main circuit, through one or more power supply terminals provided respectively to the interface circuits. From a signal source to each gate drive, an isolated signal is transmitted.

US2012/0299393 (PTD 4) discloses a breaker circuit breaking a current flowing through a power supply line, by means of a high-speed switch having series-connected power semiconductor switches.

CITATION LIST

Patent Document

PTD 1: Japanese Patent Laying-Open No. 2000-4059
PTD 2: Japanese Patent Laying-Open No. 3-237813
PTD 3: Japanese Patent Laying-Open No. 2009-177951
PTD 4: US 2012/0299393

SUMMARY OF INVENTION

Technical Problem

In the case where a semiconductor switch circuit made up of a plurality of semiconductor switching devices connected in series is used to perform switching for a voltage of a few tens of kV, for example, the power feeding method of PTD 1 causes the following problems.

The secondary side of the insulation transformer in PTD 1 is in the floating state relative to the ground, and therefore, the potential difference between the primary winding and the secondary windings of the insulation transformer is a high voltage of a few tens of kV. In the case where an insulation voltage of a few tens of kV or more between the primary winding and the secondary windings is ensured, it is difficult to avoid an increase in size and/or an increase in weight of the transformer. Further, the transformer having a structure in which many secondary outputs are derived from one transformer core causes problems of an increase in cost due to complication of wiring and/or insulation between wires, and complication of the assembly and/or the maintenance and inspection.

Further, in the case where the primary winding and the secondary winding of the transformer are insulated from each other with an insulating material therebetween, a stray capacitance (transformer coupling capacitance) on the order of from a few hundreds to a few thousands of pF is formed between the primary and the secondary windings with the insulating material having a large dielectric constant acting as a dielectric. At the moment the semiconductor switch circuit connected to the transformer having this stray capacitance is switched from ON to OFF, the value of the voltage applied to each of semiconductor switching devices which form the semiconductor switch circuit is a value of a fraction determined by dividing a high voltage of a few tens of kV by the transformer coupling capacitances and the output capacitances of the semiconductor switching devices. The value of the fraction of the divided voltage for a semiconductor switching device located closer to the high-voltage side is larger. As a result, it is necessary to employ a semiconductor switching device having an excessively high breakdown voltage characteristic, resulting in a problem that the cost of the semiconductor switch circuit increases.

In order to eliminate the imbalance between the fractions of the divided voltage, a method may be adopted in some cases according to which respective values of capacitors connected in parallel with semiconductor switching devices are set so that the capacitor value of a semiconductor switching device located relatively closer to the high voltage side is relatively larger. This, however, leads to an increase of the number of parts and accordingly problems of an increase in size and/or an increase in cost of the semiconductor switch circuit.

PTD 2 discloses that DC-DC converters of the pulse generation circuit adjust differences between forward voltages of diodes, and the voltages are smoothed by capacitors and thereafter input to the field-effect transistors. This configuration aims to make uniform the voltages supplied as power supply voltages to respective gate circuits. To the anode of each diode, the voltage of the DC power supply is applied, and the cathode thereof supplies the voltage to the DC-DC converter.

The cathode of each diode is connected to the source of the field-effect transistor via the capacitor. To each of the series-connected field-effect transistors, a high voltage of the high-voltage power supply is applied via a charging reactor and a charging diode. This high voltage is applied to the cathode of each diode when the current path of the series-connected field-effect transistors is changed from the conduction state to the non-conduction state. The diodes are connected in parallel between the series-connected field-effect transistors and a ground line, and therefore reversebiased by the high voltage of the high-voltage power supply. In order to prevent breakage of the diode due to the reverse bias, a diode having a high breakdown voltage appropriate for addressing the reverse bias voltage is necessary, which results in an increase in size and/or an increase in price of the pulse generation circuit.

The present invention has been made to solve the problems as described above, and implements a semiconductor switch circuit including a plurality of semiconductor switching devices connected in series, and capable of reducing the value of a reverse bias voltage applied to each rectifying device when the associated semiconductor switching device is switched from ON to OFF, while supplying uniform gate voltages to respective gates of the semiconductor switching devices. Other problems and new characteristics will become apparent from the description herein and the attached drawings.

Solution to Problem

A semiconductor switch circuit includes first to N-th (N is an integer of 2 or more) switching units connected in series between a high-voltage node and a low-voltage node, and first to N-th rectifying devices provided in association with the first to N-th switching units, respectively. Respective cathodes of the first to N-th rectifying devices are connected to the first to N-th switching units, respectively, respective anodes of the first to (N−1)-th rectifying devices are connected to respective cathodes of the second to N-th rectifying devices, respectively, and an anode of the N-th rectifying device receives a predetermined DC voltage. A voltage value of the high-voltage node is higher than a voltage value of the low-voltage node. The first to N-th switching units each include a semiconductor switching device, a gate drive circuit to drive the semiconductor switching device, and a DC-DC converter to receive a DC voltage from the cathode of an associated rectifying device and supply drive power to the gate drive circuit. The N semiconductor switching devices included respectively in the first to N-th switching units are connected in series between the high-voltage node and the low-voltage node.

Advantageous Effects of Invention

A small-sized and low-cost semiconductor switch circuit in which the voltage imbalance between series-connected semiconductor switching devices is improved is implemented.

DESCRIPTION OF EMBODIMENTS

Figure 1:
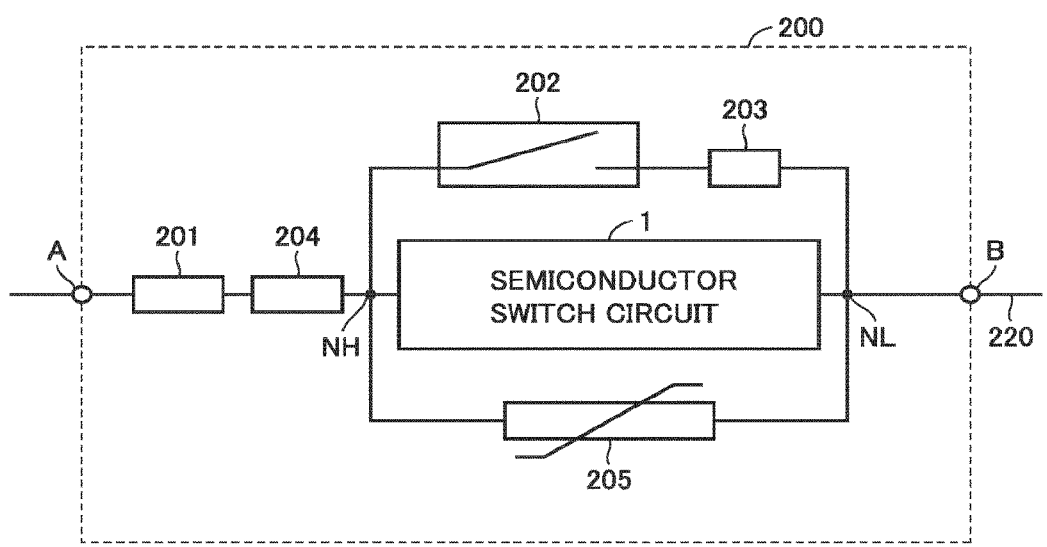
FIG. 1 is a circuit block diagram illustrating a configuration of a semiconductor DC circuit breaker including a semiconductor switch circuit according to a first embodiment.

Embodiments will hereinafter be described with reference to the drawings. The number, amount, or the like mentioned in the description of the embodiments is not necessarily limited to the exact number, amount, or the like unless otherwise specified. In the drawings of the embodiments, the same reference characters or reference numerals denote the same parts or corresponding parts. Moreover, in the description of the embodiments, a description of the parts denoted by the same reference characters or the like will not be repeated in some cases.

First Embodiment

FIG. 1 is a circuit block diagram illustrating a configuration of a semiconductor DC circuit breaker 200 including a semiconductor switch circuit 1 according to a first embodiment.

Semiconductor DC circuit breaker 200 is arranged between a connection point A and a connection point B of a DC power transmission path 220 of a few tens of kV/a few kA or more, for example, for breaking a power transmission current or a fault current. Semiconductor DC circuit breaker 200 has one end and the other end connected to connection point A and connection point B, respectively. A high-voltage node NH is connected to one end of a residual-current-breaking DC circuit breaker 204, and a low-voltage node NL is connected to connection point B. Residual-current-breaking DC circuit breaker 204 has the other end connected to one end of a current-limiting reactor 201. Current-limiting reactor 201 has the other end connected to connection point A.

Between high-voltage node NH and low-voltage node NL, an auxiliary DC disconnector 203 and a high-speed disconnector 202 are connected in series. Auxiliary DC disconnector 203 has one end and the other end connected respectively to low-voltage node NL and one end of high-speed disconnector 202. High-speed disconnector 202 has the other end connected to high-voltage node NH. Between high-voltage node NH and low-voltage node NL, a nonlinear resistor 205 is further connected. Namely, between high-voltage node NH and low-voltage node NL, series-connected auxiliary DC disconnector 203 and high-speed disconnector 202, semiconductor switch circuit 1, and nonlinear resistor 205 are connected in parallel.

Operation of Semiconductor DC Circuit Breaker 200

During normal power transmission, high-speed disconnector 202, auxiliary DC disconnector 203, and semiconductor switch circuit 1 are all in the conduction state. A series circuit made up of high-speed disconnector 202 and auxiliary DC disconnector 203 has a conducting voltage sufficiently smaller than a conducting voltage of semiconductor switch circuit 1. Accordingly, a DC power transmission current flows to the DC circuit made up of high-speed disconnector 202 and auxiliary DC disconnector 203.

In this conducting state, if it becomes necessary to interrupt current of DC power transmission path 220 due to some circumstances, initially auxiliary DC disconnector 203 is turned off. At this moment, the current of DC power transmission path 220 (hereinafter also referred to as DC power transmission current) is commutated from the series circuit made up of high-speed disconnector 202 and auxiliary DC disconnector 203 to semiconductor switch circuit 1 which is on standby in the ON state. The commutation of the DC power transmission current to semiconductor switch circuit 1 causes the value of the current of high-speed disconnector 202 to become substantially zero. At this timing, high-speed disconnector 202 is opened. The fact that the current of high-speed disconnector 202 becomes substantially zero allows arc not to be ignited between contacts of high-speed disconnector 202, and therefore, high-speed disconnector 202 is immediately opened.

After high-speed disconnector 202 is opened, semiconductor switch circuit 1 is turned off. Accordingly, DC power transmission current is commutated to nonlinear resistor 205 and the value of the DC power transmission current is significantly reduced. At the time when the DC power transmission current has sufficiently been reduced, residual-current-breaking DC circuit breaker 204 is opened. At this time, no arc is ignited between contacts of residual-current-breaking DC circuit breaker 204, and therefore, residual-current-breaking DC circuit breaker 204 is also immediately opened. Through the above-described series of operations, DC power transmission path 220 is finally interrupted reliably and speedily.

Figure 2:
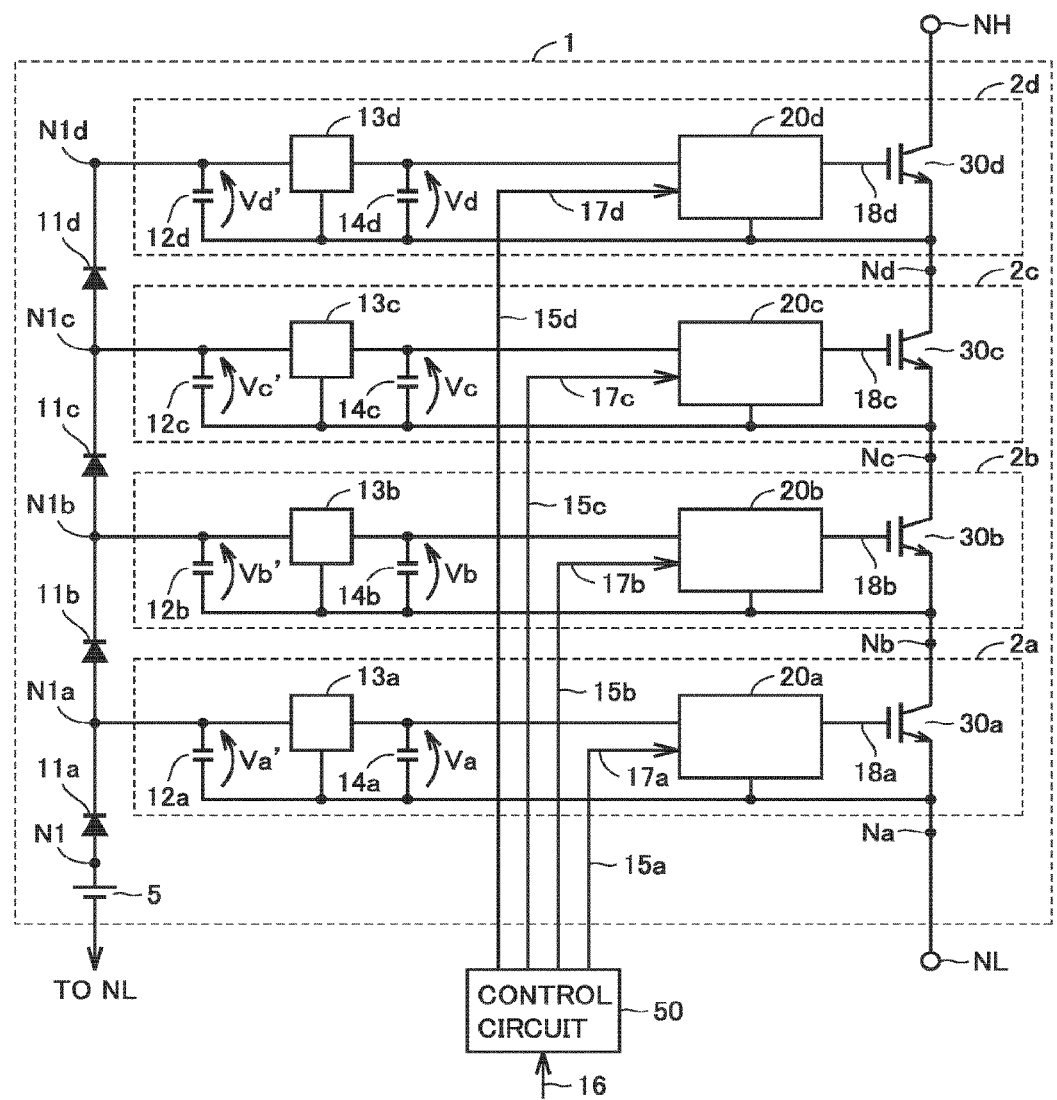
FIG. 2 is a circuit diagram of the semiconductor switch circuit according to the first embodiment.

FIG. 2 is a circuit diagram of semiconductor switch circuit 1 according to the first embodiment.

Overall Configuration of Semiconductor Switch Circuit 1

An overall configuration of semiconductor switch circuit 1 is now described.

Semiconductor switch circuit 1 includes switching units 2a to 2d, charging diodes 11a to 11d, and a DC power supply 5.

Switching unit 2a includes a semiconductor switching device 30a, a gate drive circuit 20a, a DC-DC converter 13a, an input capacitor 12a, and a smoothing capacitor 14a.

Semiconductor switching device 30a is a high-speed semiconductor device of the voltage-controlled self-arc-extinguishing type, and is exemplarily MOSFET (Field-Effect Transistor) or IGBT (Insulated Gate Bipolar Transistor). Use of a wide-band-gap semiconductor such as silicon carbide (SiC) or gallium nitride (GaN) having a high-speed switching property makes it possible to implement semiconductor switch circuit 1 capable of faster operation. FIG. 2 shows an example where an IGBT is employed as semiconductor switching device 30a.

Semiconductor switching device 30a of switching unit 2a has its emitter connected via a switch connection node Na to low-voltage node NL, and semiconductor switching device 30d of switching unit 2d has its collector connected to high-voltage node NH.

Switching units 2a and 2b share a switch connection node Nb, the collector of semiconductor switching device 30a of switching unit 2a and the emitter of semiconductor switching device 30b of switching unit 2b are both connected to switch connection node Nb. Switching units 2b and 2c share a switch connection node Nc, and switching units 2c and 2d share a switch connection node Nd. As a result of this, semiconductor switching devices 30a to 30d are connected in series between high-voltage node NH and low-voltage node NL.

The anode terminal of charging diode 11a is connected to a diode connection node N1. The cathode terminal of charging diode 11a and the anode terminal of charging diode 11b are connected to each other via a diode connection node N1a. The cathode terminal of charging diode 11b and the anode terminal of charging diode 11c are connected to each other via a diode connection node N1b. The cathode terminal of charging diode 11c and the anode terminal of charging diode 11d are connected to each other via a diode connection node N1c. The cathode terminal of charging diode 11d is connected to a diode connection node N1d.

As a result of this, charging diodes 11a to 11d are connected in series between diode connection node N1 and diode connection node N1d via diode connection nodes N1a to N1c. The anode terminal of charging diode 11a is connected to the positive electrode of DC power supply 5 via diode connection node N1, and the negative electrode of DC power supply 5 is connected to low-voltage node NL. DC power supply 5 is a DC power supply such as battery, or a DC power supply implemented by an AC-DC converter or the like.

In response to a control signal 16, a control circuit 50 outputs drive signals 17a to 17d to gate drive circuits 20a to 20d through optical fibers 15a to 15d, respectively.

Configuration of Switching Units 2a-2d

A configuration of switching units 2a to 2d is now described.

In switching unit 2a, one end of input capacitor 12a is connected to the cathode terminal of charging diode 11a and to an input terminal of DC-DC converter 13a. To an output terminal of DC-DC converter 13a, one end of smoothing capacitor 14a is connected. To the other end of input capacitor 12a, the other end of smoothing capacitor 14a, and DC-DC converter 13a, a voltage of switch connection node Na is applied.

When a voltage of the cathode terminal of charging diode 11a causes input capacitor 12a to be charged so that the voltage across the opposite terminals of input capacitor 12a is increased to an input voltage Va' which is necessary to operate DC-DC converter 13a, DC-DC converter 13a converts input voltage Va' to an output voltage Va which is necessary for gate drive circuit 20a to operate, and charges smoothing capacitor 14a.

When output voltage Va and drive signal 17a are input to gate drive circuit 20a, gate drive circuit 20a raises the voltage value of a gate drive signal 18a to a value that causes semiconductor switching device 30a to be turned on. Specifically, the voltage value of gate drive signal 18a is raised so that the value of the forward voltage between the gate and the emitter of semiconductor switching device 30a becomes equal to or more than a threshold voltage. In response to this gate drive signal 18a, semiconductor switching device 30a changes from the OFF state to the ON state.

While the forgoing is a description of the configuration of switching unit 2a, the configuration of other switching units 2b to 2d is similar to the above-described one. The subscript "a" of input capacitor 12a, gate drive circuit 20a, and the like included in switching unit 2a may be replaced with "b" or the like to thereby allow understanding of the configuration of switching unit 2b or the like.

Respective values of output voltages Va to Vd of smoothing capacitors 14a to 14d which are charged respectively by DC-DC converters 13a to 13d are set to desired values equal to each other, as will be described later herein. It should be noted, however, as long as the non-uniformity of the switching timing of semiconductor switching devices 30a to 30d is eliminated, respective values of output voltages Va to Vd may not necessarily be completely equal to each other and a voltage difference to a certain extent is allowable.

Figure 3:
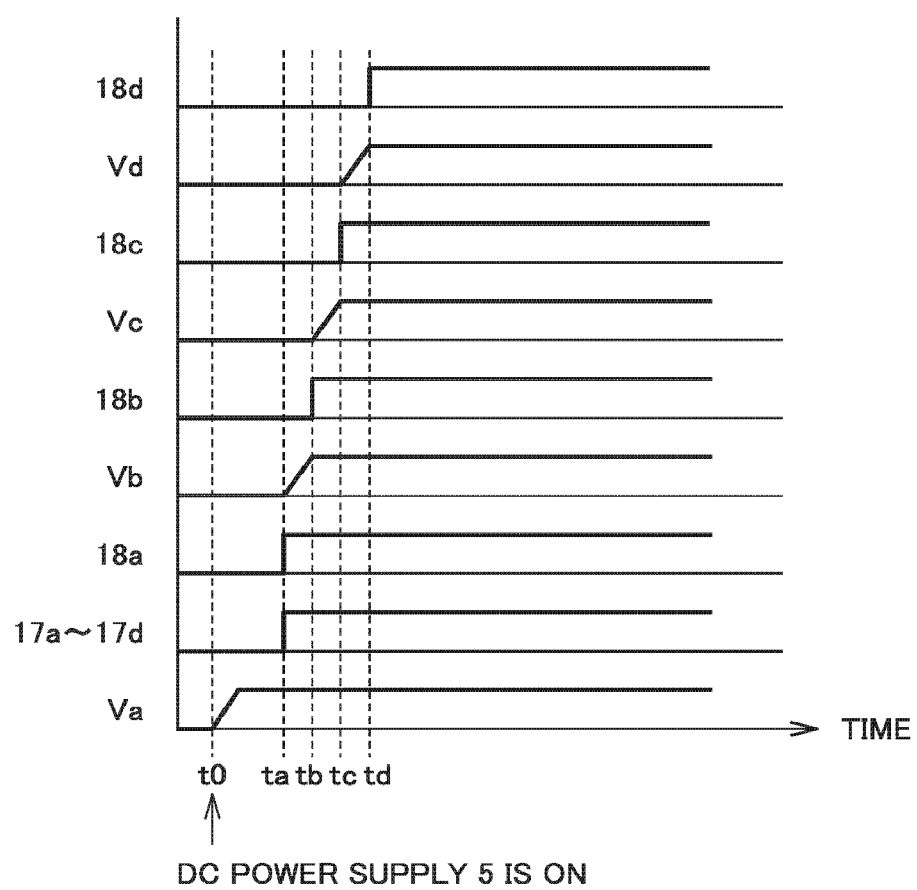
FIG. 3 is a timing diagram illustrating an operation of the semiconductor switch circuit according to the first embodiment.

FIG. 3 is a timing diagram illustrating an operation of semiconductor switch circuit 1 according to the first embodiment.

In FIG. 3, the horizontal axis indicates time and the vertical axis indicates waveforms of gate drive signals 18a to 18d, output voltages Va to Vd of smoothing capacitors 14a to 14d, and drive signals 17a to 17d, in switching units 2a to 2d.

Operation of Semiconductor Switch Circuit 1 in Period from Time t0 to Time ta

While residual-current-breaking DC circuit breaker 204 is in the open state or DC power transmission current flows through high-speed disconnector 202 and auxiliary DC disconnector 203, namely while the voltage applied to semiconductor switch circuit 1 is sufficiently low, the voltage of DC power supply 5 is applied to the anode of charging diode 11a at time t0.

Figure 4:
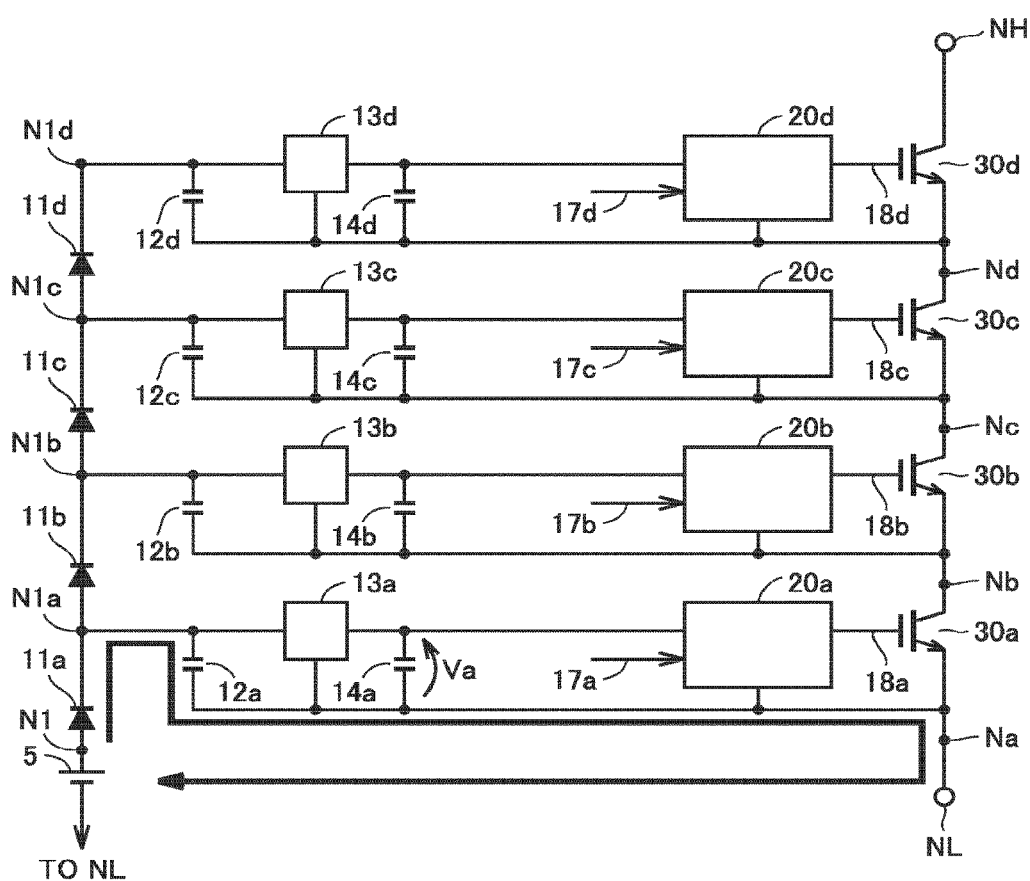
FIG. 4 is a circuit diagram illustrating an operation of the semiconductor switch circuit according to the first embodiment, in the period from time t0 to time ta in FIG. 3.

FIG. 4 is a circuit diagram illustrating an operation of semiconductor switch circuit 1 according to the first embodiment, in the period from time t0 to time ta in FIG. 3.

As shown in FIG. 4, at time t0, a closed circuit is formed by charging diode 11a in the conduction state, input capacitor 12a, switch connection node Na, low-voltage node NL, and DC power supply 5 and then, input capacitor 12a starts being charged. DC-DC converter 13a converts input voltage Va' (see FIG. 2) from input capacitor 12a to output voltage Va, and charges, before time ta, smoothing capacitor 14a to output voltage Va necessary for gate drive circuit 20a to operate.

Operation of Semiconductor Switch Circuit 1 in Period from Time ta to Time tb

In FIG. 3, at time ta, control circuit 50 simultaneously outputs drive signals 17a to 17d to gate drive circuits 20a to 20d, respectively. At this time, gate drive circuit 20a to which output voltage Va necessary for its operation has already been input responds to drive signal 17a to output gate drive signal 18a to the gate of semiconductor switching device 30a. In response to gate drive signal 18a, semiconductor switching device 30a immediately changes from the OFF state to the ON spate at time ta.

Figure 5:
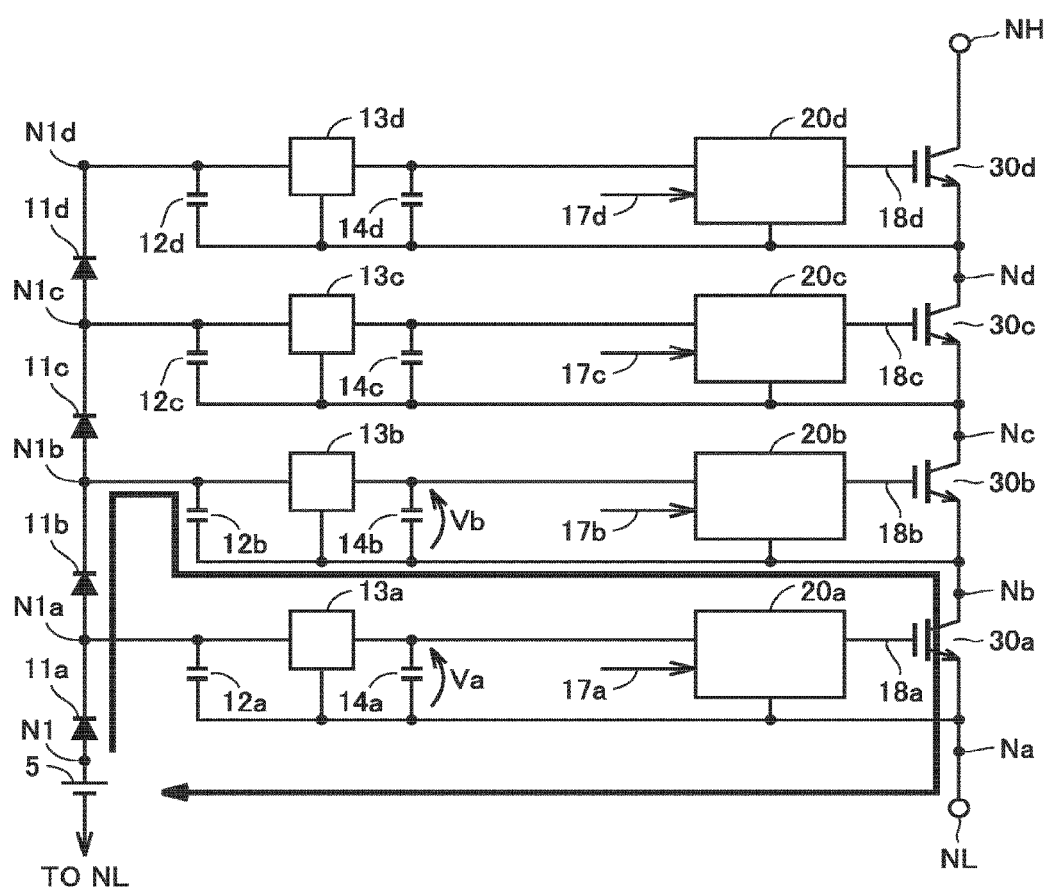
FIG. 5 is a circuit diagram illustrating an operation of the semiconductor switch circuit according to the first embodiment, in the period from time ta to time tb in FIG. 3.

FIG. 5 is a circuit diagram illustrating an operation of semiconductor switch circuit 1 according to the first embodiment, in the period from time ta to time tb in FIG. 3.

As shown in FIG. 5, turn-on of semiconductor switching device 30a causes a closed circuit to be formed by charging diode 11a, charging diode 11b, input capacitor 12b, semiconductor switching device 30a, low-voltage node NL, and DC power supply 5, and input capacitor 12b starts being charged. DC-DC converter 13b converts input voltage Vb' (see FIG. 2) from input capacitor 12b to output voltage Vb. At time tb, DC-DC converter 13b has charged smoothing capacitor 14b to output voltage Vb necessary for gate drive circuit 20b to operate.

Operation of Semiconductor Switch Circuit 1 in Period from Time tb to Time tc

In FIG. 3, at time tb, DC-DC converter 13b has charged smoothing capacitor 14b to output voltage Vb necessary for gate drive circuit 20b to operate. Then, gate drive circuit 20b outputs, to the gate of semiconductor switching device 30b, gate drive signal 18b together with drive signal 17b which has already been output by control circuit 50. In response to this gate drive signal 18b, semiconductor switching device 30b immediately changes from the OFF state to the ON state at time tb.

Figure 6:
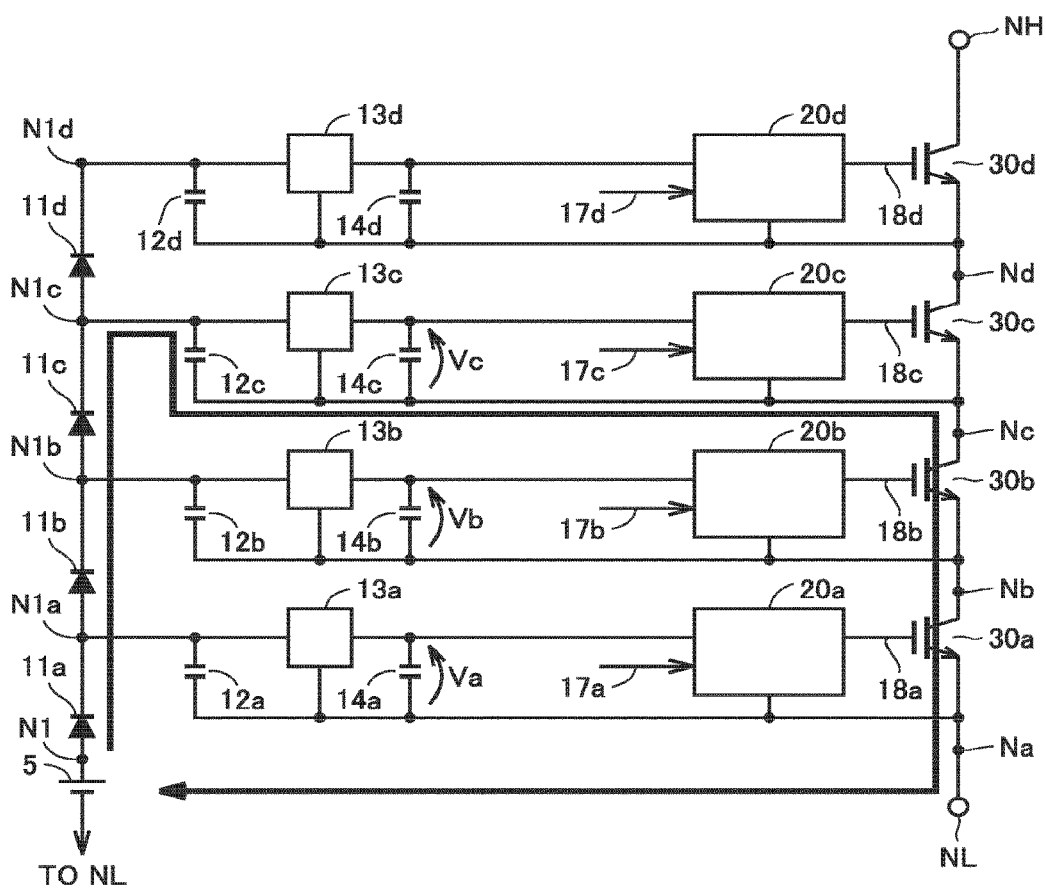
FIG. 6 is a circuit diagram illustrating an operation of the semiconductor switch circuit according to the first embodiment, in the period from time tb to time tc in FIG. 3.

FIG. 6 is a circuit diagram illustrating an operation of semiconductor switch circuit 1 according to the first embodiment, in the period from time tb to time tc in FIG. 3.

As shown in FIG. 6, turn-on of semiconductor switching device 30b causes a closed circuit to be formed by charging diodes 11a to 11c, input capacitor 12c, semiconductor switching devices 30a to 30b, low-voltage node NL, and DC power supply 5, and input capacitor 12c starts being charged. DC-DC converter 13c converts input voltage Vc' (see FIG. 2) from input capacitor 12c to output voltage Vc. At time tc, DC-DC converter 13c has charged smoothing capacitor 14c to output voltage Vc necessary for gate drive circuit 20c to operate.

Operation of Semiconductor Switch Circuit 1 in Period from Time tc to Time td

In FIG. 3, at time tc, DC-DC converter 13c has charged smoothing capacitor 14c to output voltage Vc necessary for gate drive circuit 20c to operate. Then, gate drive circuit 20c outputs, to the gate of semiconductor switching device 30c, gate drive signal 18c together with drive signal 17c which has already been output by control circuit 50. In response to this gate drive signal 18c, semiconductor switching device 30c immediately changes from the OFF state to the ON state at time tc.

Figure 7:
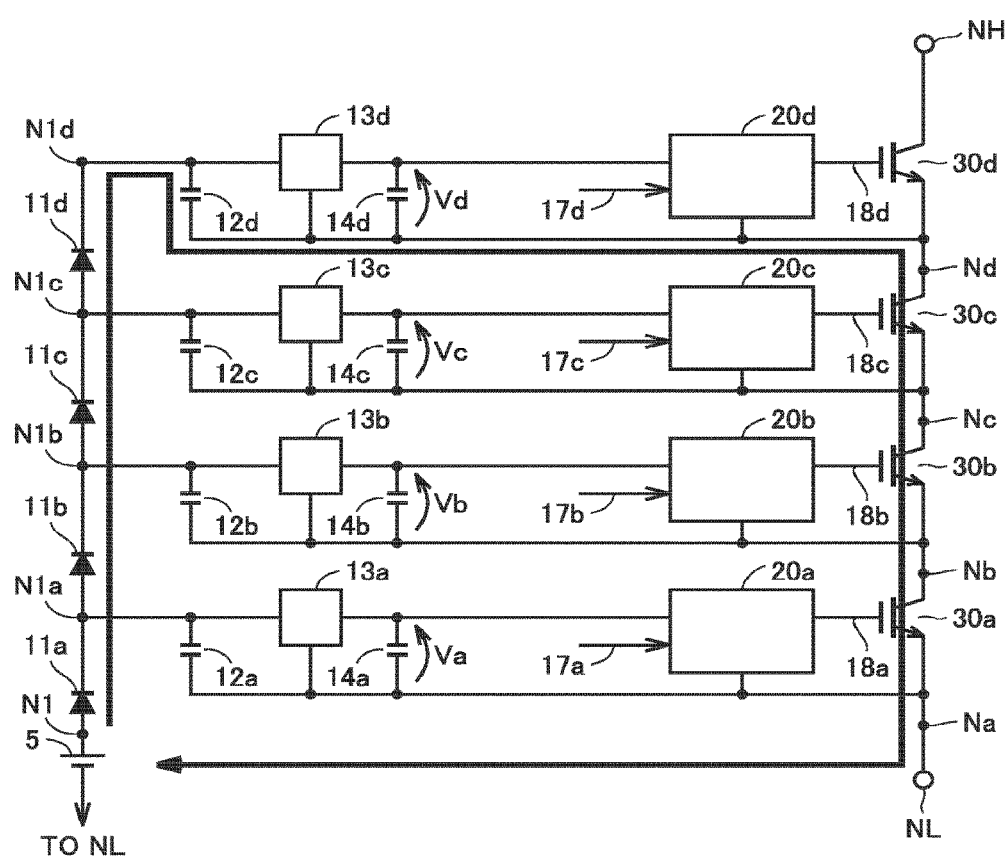
FIG. 7 is a circuit diagram illustrating an operation of the semiconductor switch circuit according to the first embodiment, in the period from time tc to time td in FIG. 3.

FIG. 7 is a circuit diagram illustrating an operation of semiconductor switch circuit 1 according to the first embodiment, in the period from time tc to time td in FIG. 3.

As shown in FIG. 7, turn-on of semiconductor switching device 30c causes a closed circuit to be formed by charging diodes 11a to 11d, input capacitor 12d, semiconductor switching devices 30a to 30c, low-voltage node NL, and DC power supply 5, and input capacitor 12d starts being charged. DC-DC converter 13d converts input voltage Vd' (see FIG. 2) from input capacitor 12d to output voltage Vd. At time td, DC-DC converter 13d has charged smoothing capacitor 14d to output voltage Vd necessary for gate drive circuit 20d to operate.

In FIG. 3, at time td, DC-DC converter 13d has charged smoothing capacitor 14d to output voltage Vd necessary for gate drive circuit 20d to operate. Then, gate drive circuit 20d outputs, to the gate of semiconductor switching device 30d, gate drive signal 18d together with drive signal 17d which has already been output by control circuit 50. In response to this gate drive signal 18d, semiconductor switching device 30d immediately changes from the OFF state to the ON state at time td.

At and after time td, semiconductor switching devices 30a to 30d are all kept in the ON state, and semiconductor switch circuit 1 is kept in the ON state.

While residual-current-breaking DC circuit breaker 204 is in the open state or DC current flows through high-speed disconnector 202 and auxiliary DC disconnector 203, the voltage applied to semiconductor switch circuit 1 is sufficiently low. Therefore, even in the case where semiconductor switching devices 30a to 30d are successively turned on in the order from a low-voltage stage, namely from semiconductor switching device 30a connected to low-voltage node NL to semiconductor switching device 30d of a high-voltage stage, the voltage applied to each of semiconductor switching devices 30a to 30d is sufficiently smaller than the rated voltage of semiconductor switching device 30a for example. Accordingly, semiconductor switch circuit 1 can surely be set to the ON state without applying an excessive voltage to semiconductor switching devices 30a to 30d.

In the case where semiconductor DC circuit breaker 200 starts a current interrupt operation and is to turn off semiconductor switch circuit 1 which has been ON, control circuit 50 simultaneously outputs drive signals 17a to 17d to gate drive circuits 20a to 20d, respectively. In response to drive signals 17a to 17d, gate drive circuits 20a to 20d simultaneously turn off semiconductor switching devices 30a to 30d, respectively, and thus semiconductor switch circuit 1 is turned off.

Turn-off of semiconductor switching devices 30a to 30d causes supply of electric power from DC power supply 5 to DC-DC converters 13a to 13d to be stopped. In order for semiconductor DC circuit breaker 200 to reliably perform the current interrupt process, it is necessary to operate gate drive circuits 20a to 20d for the period from the start to the end of the current interrupt process. It is therefore preferable that the capacitance value of smoothing capacitors 14a to 14d which supply the drive power to gate drive circuits 20a to 20d is set to a value that enables a discharging time sufficiently longer than the period from the start to the end of the current interrupt process to be ensured.

A description is now given with reference to FIG. 7. At the time when semiconductor switch circuit 1 is turned off, the voltage value of switch connection node Nd has increased to be close to the voltage value of high-voltage node NH, and therefore, a high voltage (hereinafter also referred to as breaking voltage) close to the voltage value of high-voltage node NH is applied to diode connection node N1d. At this time, to charging diodes 11a to 11d connected in series, substantially the breaking voltage is applied in the reverse bias direction. A breaking voltage applied to each of charging diodes 11a to 11d, however, has a value determined by dividing the value of the aforementioned high voltage by the number of charging diodes 11a to 11d connected in series. As a result of this, a device having an appropriate breakdown voltage can be selected as each of charging diodes 11a to 11d, and thus semiconductor switch circuit 1 is further downsized.

In FIG. 2, the value of power supply voltage VO which is output from DC power supply 5 has to be set in consideration of the characteristics of charging diodes 11a to 11d and semiconductor switching devices 30a to 30d. The conducting voltage of each of charging diodes 11a to 11d (forward voltage) is denoted by VD, the ON voltage of each of semiconductor switching devices 30a to 30d (ON voltage between the collector and the emitter) is denoted by Von, the voltage of gate drive signals 18a to 18d (the voltage between the gate and the emitter that causes semiconductor switching devices 30a to 30d to be turned on) is denoted by VG, and the number of semiconductor switching device 30a and the like connected in series is denoted by n.

In order to operate semiconductor switch circuit 1, it is necessary for the value of power supply voltage VO of DC power supply 5 to satisfy the following mathematical expression (1):

$$VO > n*VD + (n-1)*Von + VG \quad (1)$$

where symbol "*" is the multiplication sign.

As shown in FIGS. 4 to 7, with respect to the value of input voltage Va' from input capacitor 12a of switching unit 2a connected to low-voltage node NL, respective values of input voltages Vb', Vc', and Vd' are smaller in this order (Va'>Vb'>Vc'>Vd'). This is for the reason that conducting voltage VD of charging diodes 11b, 11c, and 11d adds to a greater extent for a switching unit closer to high-voltage node NH. Therefore, the values of respective breakdown voltages of input capacitors 12d, 12c, 12b are smaller than the values of respective breakdown voltages of input capacitors 12c, 12b, and 12a, respectively. Since a capacitor with a smaller breakdown voltage value is cheaper than a capacitor with a greater breakdown voltage value, the cost can be reduced relative to the case where input capacitors 12a to 12d having the same breakdown voltage values are used.

In the case where input voltages Va' to Vd' are converted by the same conversion factor by DC-DC converters 13a to 13d respectively to thereby generate output voltages Va to Vd, respective voltages of gate drive signals 18a, 18b, 18c, and 18d (gate-emitter voltage) are smaller in this order. Accordingly, semiconductor switching devices 30a to 30d are non-uniform in terms of the switching timing.

Then, the characteristics of DC-DC converters 13a to 13d are adjusted so that they generate output voltages Va to Vd having respective values identical to each other, from input voltages Va' to Vd' having respective values different from each other, to thereby make uniform, in terms of the switching timing, semiconductor switching devices 30a to 30d. It should be noted that as long as the non-uniformity of the switching timing of semiconductor switching devices 30a to 30d is eliminated, respective values of output voltages Va to Vd may not necessarily be completely equal to each other and a voltage difference to a certain extent is allowable.

A description is now given of the effects of semiconductor switch circuit 1 according to the first embodiment. In the following description, the description regarding switching unit 2a is an exemplary description which may also serve as a description of switching units 2a to 2d, unless otherwise specified. The description of charging diode 11a for example is also an exemplary one.

Semiconductor switch circuit 1 includes a plurality of switching units 2a to 2d connected in series between high-voltage node NH and low-voltage node NL, and a plurality of charging diodes 11a to 11d connected in series between diode connection nodes N1 and N1d. Switching unit 2a uses charging diode 11a to charge input capacitor 12a so that the voltage across the terminals of input capacitor 12a increases to input voltage Va'. DC-DC converter 13a converts input voltage Va' to output voltage Va and charges smoothing capacitor 14a. Gate drive circuit 20a receives drive power from smoothing capacitor 14a and generates gate drive signal 18a. When the voltage value of gate drive signal 18a becomes larger than a predetermined value, semiconductor switching device 30a is turned on.

The ON/OFF operation of semiconductor switching device 30a is determined based on the drive power generated by DC-DC converter 13a and drive signal 17a which is output from control circuit 50. In contrast to PTD 1, semiconductor switch circuit 1 does not employ the configuration where AC voltages generated by a plurality of different secondary windings with respect to a primary winding in a transformer are converted to DC voltages and the DC voltages are fed to respective gate drive circuits. Semiconductor switch circuit 1 therefore solves various problems (increase in size, increase in weight, increase in cost, complication of maintenance and inspection, excessive increase of the breakdown voltage of the semiconductor switching device) resultant from the fact that the insulation voltage between the primary winding and the secondary winding of the transformer is ensured and/or resultant from the transformer coupling capacitance.

DC-DC converters 13a to 13d generate output voltages Va to Vd having the same values, respectively, in consideration of decreases of input voltages Va' to Vd' relative to each other from input capacitors 12a to 12d which are charged by charging diodes 11a to 11d. As a result of this, respective switching timings of semiconductor switching devices 30a to 30d are made uniform, and the response speed of semiconductor switch circuit 1 is enhanced.

Semiconductor switch circuit 1 supplies respective cathode voltages of series-connected charging diodes 11a to 11d to switching units 2a to 2d, respectively. When semiconductor switch circuit 1 changes from the ON state to the OFF state, a reverse voltage close to the voltage of high-voltage node NH is applied to series-connected charging diodes 11a to 11d. The value of the reverse voltage applied to each of charging diodes 11a to 11d, however, is substantially a value determined by dividing the voltage of high-voltage node NH by the number of charging diodes 11a to 11d. Thus, a diode which withstands the reverse voltage determined by this division can be applied as a charging diode. As a result of this, semiconductor switch circuit 1 is further downsized.

Modification of First Embodiment

Figure 8:
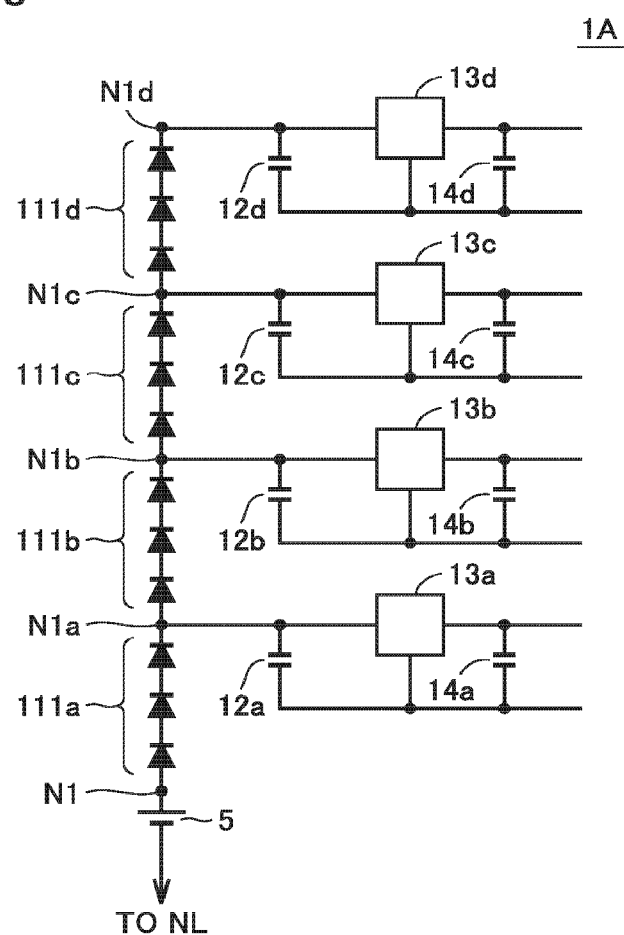
FIG. 8 is a circuit diagram illustrating a part of a semiconductor switch circuit according to a modification of the semiconductor switch circuit of the first embodiment.

FIG. 8 is a circuit diagram illustrating a part of a semiconductor switch circuit 1A according to a modification of semiconductor switch circuit 1 of the first embodiment.

Semiconductor switch circuit 1A shown in FIG. 8 differs from semiconductor switch circuit 1 shown in FIG. 2 in the following respect. Specifically, regarding diode connection nodes N1 to N1d shown in FIG. 2, the anode and the cathode of charging diode 11a are connected respectively to one (N1 for example) and the other (N1a) of diode connection nodes adjacent to each other. Between other diode connection nodes adjacent to each other as well, one charging diode is connected. The remaining circuit configuration which is not shown in FIG. 8 is identical to the corresponding circuit configuration shown in FIG. 2.

Regarding diode connection nodes N1 to N1d shown in FIG. 8, the anode and the cathode of a charging diode unit 111a are connected respectively to one (N1) and the other (N1a) of diode connection nodes adjacent to each other. Charging diode unit 111a is made up of three charging diodes connected in series. Between other diode connection nodes adjacent to each other as well, an appropriate one of charging diode units 111b to 111d is connected. The remaining circuit configuration of semiconductor switch circuit 1A is identical to the corresponding circuit configuration of semiconductor switch circuit 1.

As described above with reference to FIG. 7, when semiconductor switch circuit 1A is turned off, a breaking voltage is applied between diode connection nodes N1d and N1. Since charging diode units 111a to 111d are each made up of three charging diodes connected in series, the voltage value of the reverse bias applied to one charging diode is one-third of the voltage value of the reverse bias applied to each of charging diodes 11a to 11d of semiconductor switch circuit 1.

As a result of this, the required breakdown voltage value of the charging diodes forming charging diode units 111a to 111d in semiconductor switch circuit 1A of the modification of the first embodiment is smaller than the required breakdown voltage value of charging diodes 11a to 11d in semiconductor switch circuit 1, which contributes to reduction in size and reduction in cost of semiconductor switch circuit 1A.

According to the above description of the first embodiment and its modification, semiconductor DC circuit breaker 200 shown in FIG. 1 is configured to include semiconductor switch circuit 1, series-connected high-speed disconnector 202 and auxiliary DC disconnector 203, and nonlinear resistor 205 that are connected in parallel. The connection of semiconductor switch circuit 1, high-speed disconnector 202, auxiliary DC disconnector 203, and nonlinear resistor 205 relative to each other is not limited to that of the above-described configuration, and semiconductor switch circuit 1 may be applied to any other form of connection.

Further, semiconductor switch circuit 1 shown in FIG. 2 includes four-stage switching units 2a to 2d connected in series between high-voltage node NH and low-voltage node NL. The number of stages of switching unit 2a and like units is not limited to four, and may be set appropriately depending on the value of the breaking voltage of DC power transmission path 220 applied to semiconductor switch circuit 1.

It should be construed that the embodiments disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST 1, 1A semiconductor switch circuit; 11a-11d charging diode; 12a-12d input capacitor; 13a-13d DC converter; 14a-14d smoothing capacitor; 15a-15d optical fiber; 17a-17d drive signal; 18a-18d gate drive signal; 111a-111d charging diode unit; 20a-20d gate drive circuit; 2a-2d switching unit; 30a-30d semiconductor switching device; 2a-2d switching unit; 5 DC power supply; 16 control signal; 17a-17d drive signal; 18a-18d gate drive signal; 20a-20d gate drive circuit; 30a-30d semiconductor switching device; 50 control circuit; 200 semiconductor DC circuit breaker; 201 current-limiting reactor; 202 high-speed disconnector; 203 auxiliary DC disconnector; 204 residual-current-breaking DC circuit breaker; 205 nonlinear resistor; 220 DC power transmission path; A, B connection point; N1, N1a-N1d diode connection node; Na-Nd switch connection node; NH high-voltage node; NL low-voltage node; Va'-Vd' input voltage; Va-Vd output voltage; VO power supply voltage

The invention claimed is:

1. A semiconductor switch circuit, comprising:
first to N-th (N is an integer of 2 or more) switching units connected in series between a high-voltage node and a low-voltage node;
first to N-th rectifying devices provided in association with said first to N-th switching units, respectively, and said first to N-th rectifying devices are connected in series; and
a DC power supply outputting a predetermined DC voltage, N being an integer of 2 or more, wherein
respective cathodes of said first to N-th rectifying devices are connected to said first to N-th switching units, respectively,
respective anodes of said first to (N−1)-th rectifying devices are connected to respective cathodes of said second to N-th rectifying devices, respectively,
an anode of said N-th rectifying device is connected to a positive electrode of said DC power supply and receiving said predetermined DC voltage,
a negative electrode of said DC power supply is connected to said low-voltage node,
a voltage value of said high-voltage node is higher than a voltage value of said low-voltage node,
each of said first to N-th switching units includes:
a semiconductor switching device;
a gate drive circuit to drive said semiconductor switching device; and
a DC-DC converter to receive a DC voltage from the cathode of an associated rectifying device and supply drive power to said gate drive circuit, and said N semiconductor switching devices included respectively in said first to N-th switching units are connected in series between said high-voltage node and said low-voltage node.

2. The semiconductor switch circuit according to claim 1, wherein respective output voltages of said DC-DC converters of said first to N-th switching units have the same values.

3. The semiconductor switch circuit according to claim 1, wherein said first to N-th switching units each further include an input capacitor, and said input capacitors of said first to N-th switching units have respective one terminals connected to respective cathodes of said first to N-th rectifying devices, respectively, and have respective other terminals connected to respective electrodes, associated with said low-voltage node, of said semiconductor switching devices of said first to N-th switching units, respectively.

4. The semiconductor switch circuit according to claim 3, wherein respective breakdown voltage values of said input capacitors of said first to (N−1)-th switching units are smaller respectively than respective breakdown voltage values of said input capacitors of said second to N-th switching units.

5. The semiconductor switch circuit according to claim 1, wherein respective input voltage values of said DC-DC converters of said first to (N−1)-th switching units are smaller respectively than respective input voltage values of said DC-DC converters of said second to N-th switching units.

6. The semiconductor switch circuit according to claim 1, wherein said semiconductor switching device is formed of a semiconductor having a value of a band gap larger than a value of a band gap of silicon.

7. The semiconductor switch circuit according to claim 1, wherein said semiconductor switching devices of said N-th to first switching units in non-conductive state are successively made conductive one by one by being driven by said gate drive circuits, and said semiconductor switching devices of said N-th to first switching units in conductive state are simultaneously made non-conductive by said gate drive circuits.

8. The semiconductor switch circuit according to claim 1, wherein said first to N-th rectifying devices each include one diode or a plurality of diodes connected in series.

* * * * *